US008006746B2

(12) United States Patent
Tao et al.

(10) Patent No.: US 8,006,746 B2
(45) Date of Patent: Aug. 30, 2011

(54) 3-DIMENSIONAL HIGH PERFORMANCE HEAT SINKS

(75) Inventors: Yong Xin Tao, Miami, FL (US); Ryan Moreno, Miami, FL (US); Yingli Hao, Miami, FL (US); W. Kinzy Jones, Islamorada, FL (US)

(73) Assignee: The Florida International University Board of Trustees, Miami, FL (US)

( * ) Notice: Subject to any disclaimer, the term of this patent is extended or adjusted under 35 U.S.C. 154(b) by 1432 days.

(21) Appl. No.: 10/541,803

(22) PCT Filed: Jan. 7, 2004

(86) PCT No.: PCT/US2004/000329

§ 371 (c)(1),
(2), (4) Date: May 2, 2006

(87) PCT Pub. No.: WO2004/063639

PCT Pub. Date: Jul. 29, 2004

(65) Prior Publication Data

US 2006/0254762 A1 Nov. 16, 2006

Related U.S. Application Data

(60) Provisional application No. 60/438,697, filed on Jan. 8, 2003, provisional application No. 60/468,731, filed on May 7, 2003.

(51) Int. Cl.
*H05K 7/20* (2006.01)

(52) U.S. Cl. ...................... 165/80.4; 361/699
(58) Field of Classification Search ............... 165/80.4; 361/699
See application file for complete search history.

(56) References Cited

U.S. PATENT DOCUMENTS

| 5,098,196 | A | * | 3/1992 | O'Neill | 374/11 |
| 5,248,079 | A | * | 9/1993 | Li | 228/121 |
| 5,388,635 | A | * | 2/1995 | Gruber et al. | 165/80.4 |
| 5,836,383 | A | * | 11/1998 | Zwittig | 165/167 |
| 2002/0080563 | A1 | * | 6/2002 | Pence et al. | 361/676 |

OTHER PUBLICATIONS

International Preliminary Report on Patentability dated Jul. 8, 2005.
Written Opinion dated Jul. 8, 2005.
"Ceramic Tape—Based Meso Systems Technology", Bau et al., Micro-Electro-Mechanical Systems (MEMS), DSC—vol. 66, 1998, pp. 491-498.
International Search Report in PCT/US2004/000329 dated Oct. 28, 2004.

* cited by examiner

*Primary Examiner* — Allen J Flanigan
(74) *Attorney, Agent, or Firm* — Marshall, Gerstein & Borun LLP (57) ABSTRACT

A heat sink having a very high heat transfer capability may be made from a plurality of unit elements. Each unit element includes a series of inlet tubes having a range of diameters and a series of outlet tubes also having a range of diameters. At least one inlet tube having a minimum inlet tube diameter may be in flow communication with at least one outlet tube having a minimum outlet tube diameter.

13 Claims, 10 Drawing Sheets

3-DIMENSIONAL HIGH PERFORMANCE HEAT SINKS

This application claims the benefit under 35 U.S.C. §119 (e) of U.S. provisional patent applications Ser. No. 60/438,697 (filed Jan. 8, 2003) and 60/468,731 (filed on May 7, 2003), the disclosures of which are incorporated herein by reference.

FIELD OF THE DISCLOSURE

This disclosure is related generally to methods and apparatuses for heat transfer and, more particularly, to improvements in heat sinks that use cooling fluids.

BACKGROUND OF THE INVENTION

It is known that the switching speed of microelectronics directly correlates to the cooling capacity of such device. To reach high processing rates for next generation computing devices, such as those that operate on the order of about $3.8 \times 10^{24}$ bits per second per $cm^2$, a cooling capacity on the order of about $10^5$ W/$cm^3$ may be required. This is beyond the capability of typical liquid cooled microchannel heat sinks. Recent studies on two-phase boiling micro heat sinks have not produced any promising results partly due to the unpredictable, uncontrollable bubble sized and high risk of dryout.

The present invention is directed to overcoming one or more of the problems or disadvantages associated with the prior art.

SUMMARY OF THE INVENTION

In accordance with one aspect of the invention, a heat sink having a very high heat transfer capability may be made from a plurality or unit elements. Each unit element includes a series of inlet tubes having a range of diameters and a series of outlet tubes also having a range of diameters. At least one inlet tube having a minimum inlet tube diameter is in flow communication with at least one outlet tube having a minimum outlet tube diameter.

According to one embodiment of the invention, a new, ultra-high performance micro heat sink has the following features:

(1) A 3-Dimensional (3-D) network piping geometry with a very high surface/volume ratio.

(2) A capability of reaching $10^5$ W/$cm^3$ using encapsulated nano-size phase change materials, which would result in an order of magnitude higher cooling capacity than a typical microchannel heat sink.

(3) An ability to be scalable to a submicron range, resulting in an even higher cooling capacity.

(4) An ability to be fabricated using EFAB™ technology, with the potential of mass production.

DETAILED DESCRIPTION OF THE DRAWINGS

Figure 1:
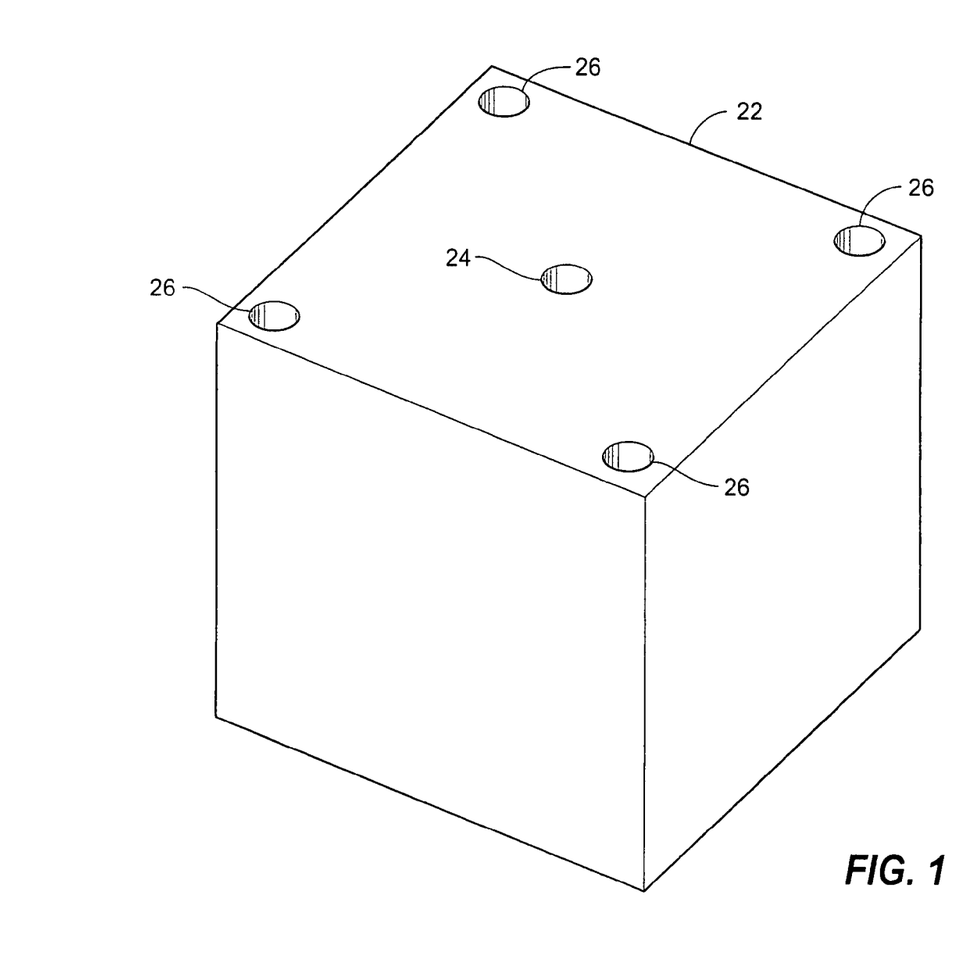
FIG. 1 is a schematic representation of a 3-dimensional micro convective piping system in a unit element.
Figure 2:
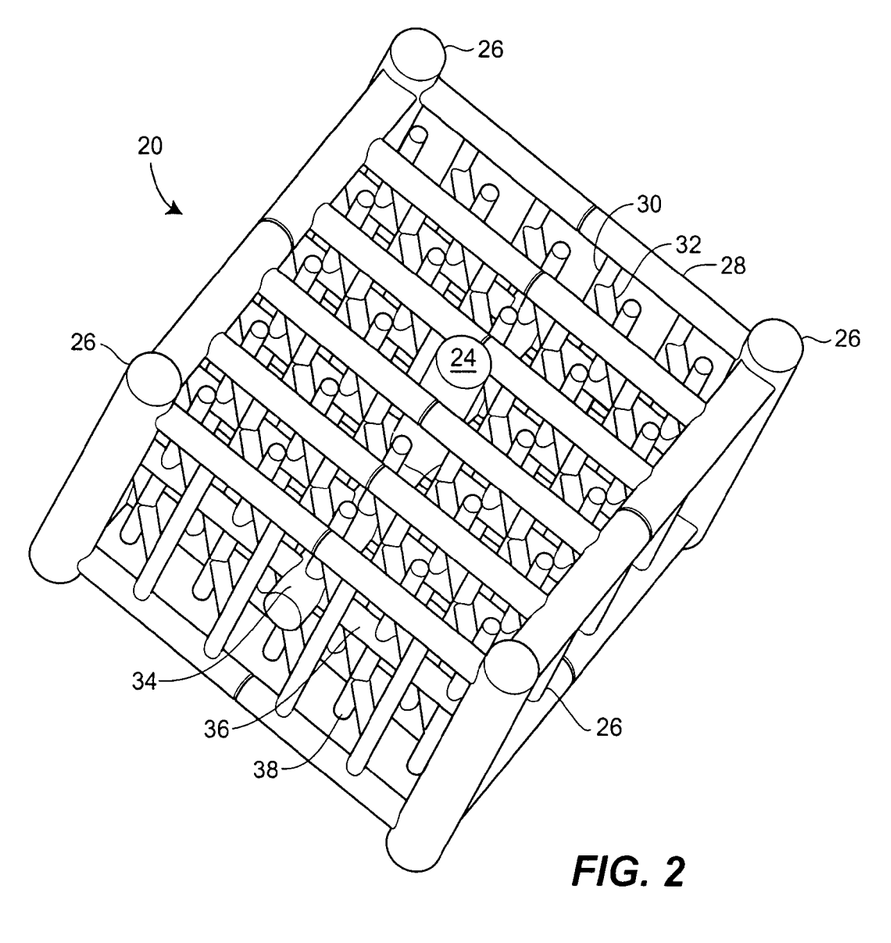
FIG. 2 is a schematic representation of an inner piping network of the unit element of FIG. 1.

FIGS. 1 and 2 depict a network piping system 20 for one unit element 22. Each unit element 22 may include a four-level nearly fractal network of tubes that are designed based on the Murray's Law, which states that, for a system of tubes containing a Newtonian fluid in laminar flow, the minimum volume for a given pressure drop occurs when the radii of the tubes at a branch point satisfy the relationship:

$$r_0^3 = r_1^3 + r_2^3 + r_3^3 + \ldots + r_n^3$$

where $r_0$ is the radius of the incoming tube, and $r_1$, $r_2$, etc., are the radii of the outgoing tubes. This piping system is somewhat similar to a biological circulatory system that links large arteries and veins via smaller vessels ultimately linked by capillary beds. The arrangement is similar to the four-level fractal system hypothesized by Drexler (1992) but with a unique design of connection.

With reference to FIG. 1, it can be seen that each unit element 22 may include a single fluid inlet tube 24 and four fluid outlet tubes 26. As seen in FIG. 2, each outlet tube 26 is in fluid communication with a series of secondary outlet tubes 28, 30, and 32 each having a successively smaller diameter, respectively. Similarly, the inlet tube 24 is in fluid communication with a series of secondary inlet tubes 34, 36, and 38, each having a successively smaller diameter, respectively. The secondary outlet tube 32 has a minimum outlet tube diameter, and the secondary inlet tube 38 has a minimum inlet tube diameter. The inlet tube 38 having the minimum inlet tube diameter is in fluid communication with at least one of the secondary outlet tubes 32 having the minimum outlet tube diameter. In order to maximize the performance of a heat sink, the unit element 22 may be configured according to Murray's Law. In the example of a tube configuration shown in FIG. 2, the radius, r.sub.34, of the inlet tube 24, that connects with four of the tubes 34 may therefore be defined as follows:

$$r^3_{24} = 4*(r^3_{34})$$

where $r_{34}$ is the radius of each of the tubes 34. In this configuration, an intersection may be the intersection of two or more tubes, which are inlet tubes and/or outlet tubes. In some embodiments, some of the intersections have an incoming flow, a first outgoing flow perpendicular to the incoming flow, and a second outgoing flow orthogonal to the first outgoing flow. For example, the intersection of the tubes 24 and 34 in FIG. 2 includes an incoming fluid flow and five outgoing flows. Four of the five outgoing flows from the intersection of the tubes 24 and 34 (i.e., the flows from the tube 24 to the tubes 34) are perpendicular to the incoming flow of the intersection. Three of the five outgoing flows from the intersection of the tubes 24 and 34 i.e., the outgoing flow in the tube 24 and two of the outgoing flows in the tube 34) are orthogonal to any outgoing flow chosen as perpendicular to the incoming flow. Some of the intersections may have fewer or more outgoing flows and/or may have outgoing flows that are not orthogonal to each other. Additionally, and as depicted in FIG. 2, an intersection may have an outgoing flow that has a flow axis coaxial, or substantially coaxial, with the incoming flow (e.g., a continuation of the tube through which the incoming flow flows). This outgoing flow may be the outgoing flow that is orthogonal to the first outgoing flow.

Figure 3:
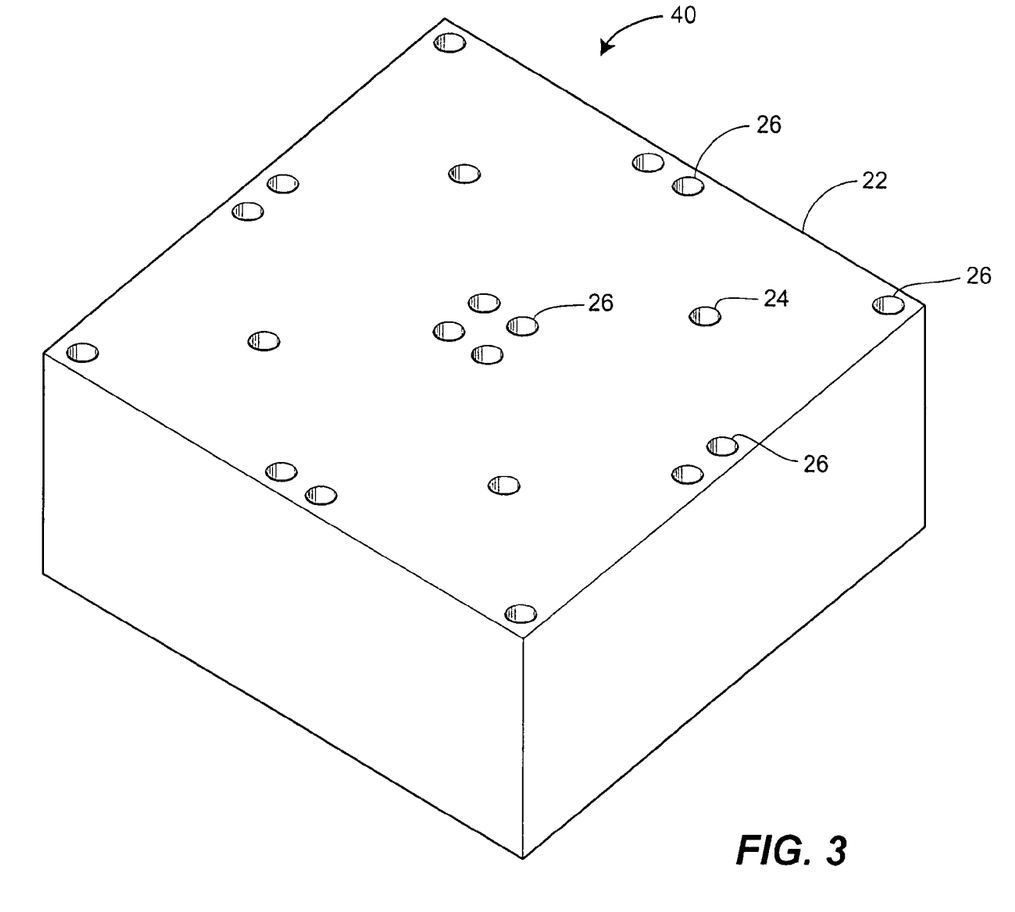
FIG. 3 is a schematic representation of a two-by-two array of four of the unit elements of FIG. 1.
Figure 4:
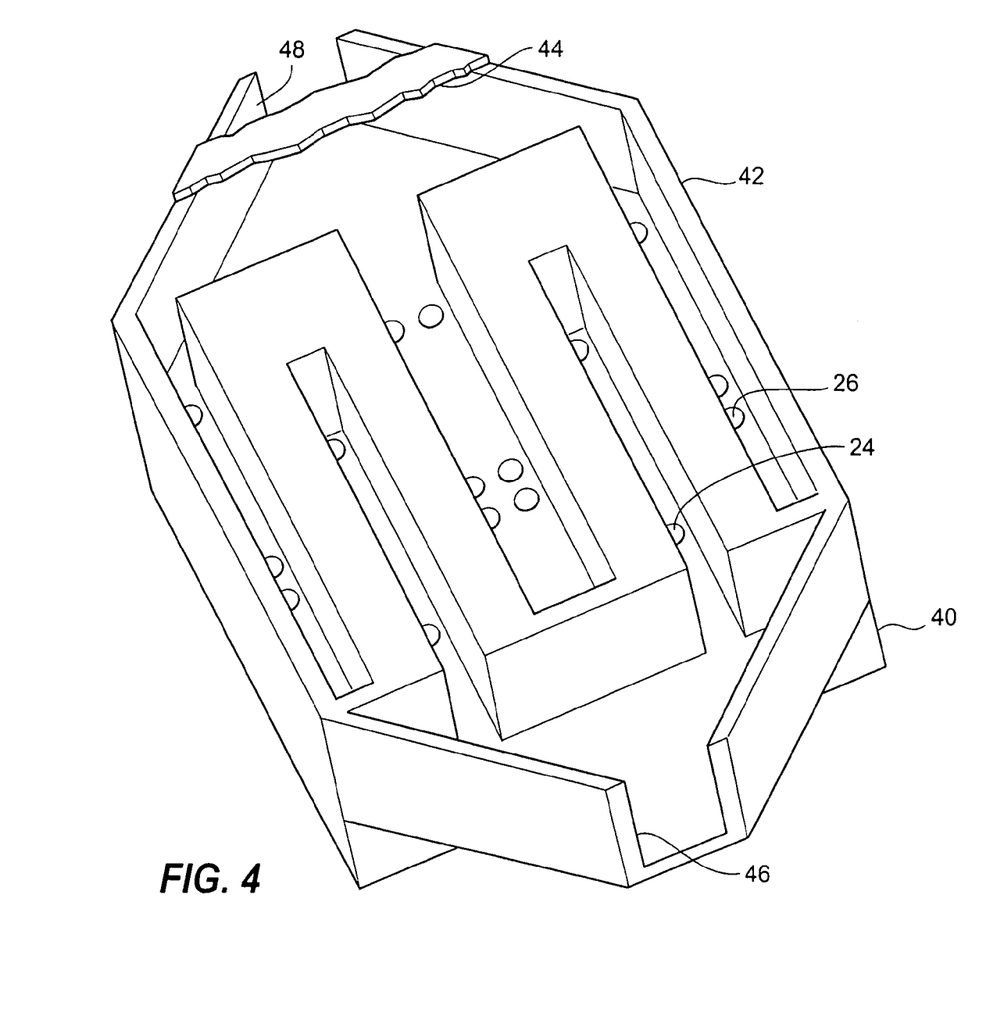
FIG. 4 is a schematic representation of an exemplary heat sink assembly having a manifold attached to the array of four unit elements of FIG. 3.

As shown in FIG. 3, numerous unit elements 22 may be attached to one another (or, if desired, formed together with one another), for example, to form a four-unit heat sink assembly 40. As shown in FIG. 4, a manifold may be attached to the four-unit heat sink assembly 40, and may include a cover plate 44 of which only a small portion is shown in FIG. 4 for clarity, as well as an inlet opening 46, and an outlet opening 48. As seen in FIG. 4, the manifold 42 may also include a convoluted wall portion 50 so that the inlet opening 46 is in fluid communication with the fluid inlet tubes 24, and the outlet opening 48 is in fluid communication with the fluid outlet tubes 26 of the four-unit heat sink assembly 40.

Figure 5:
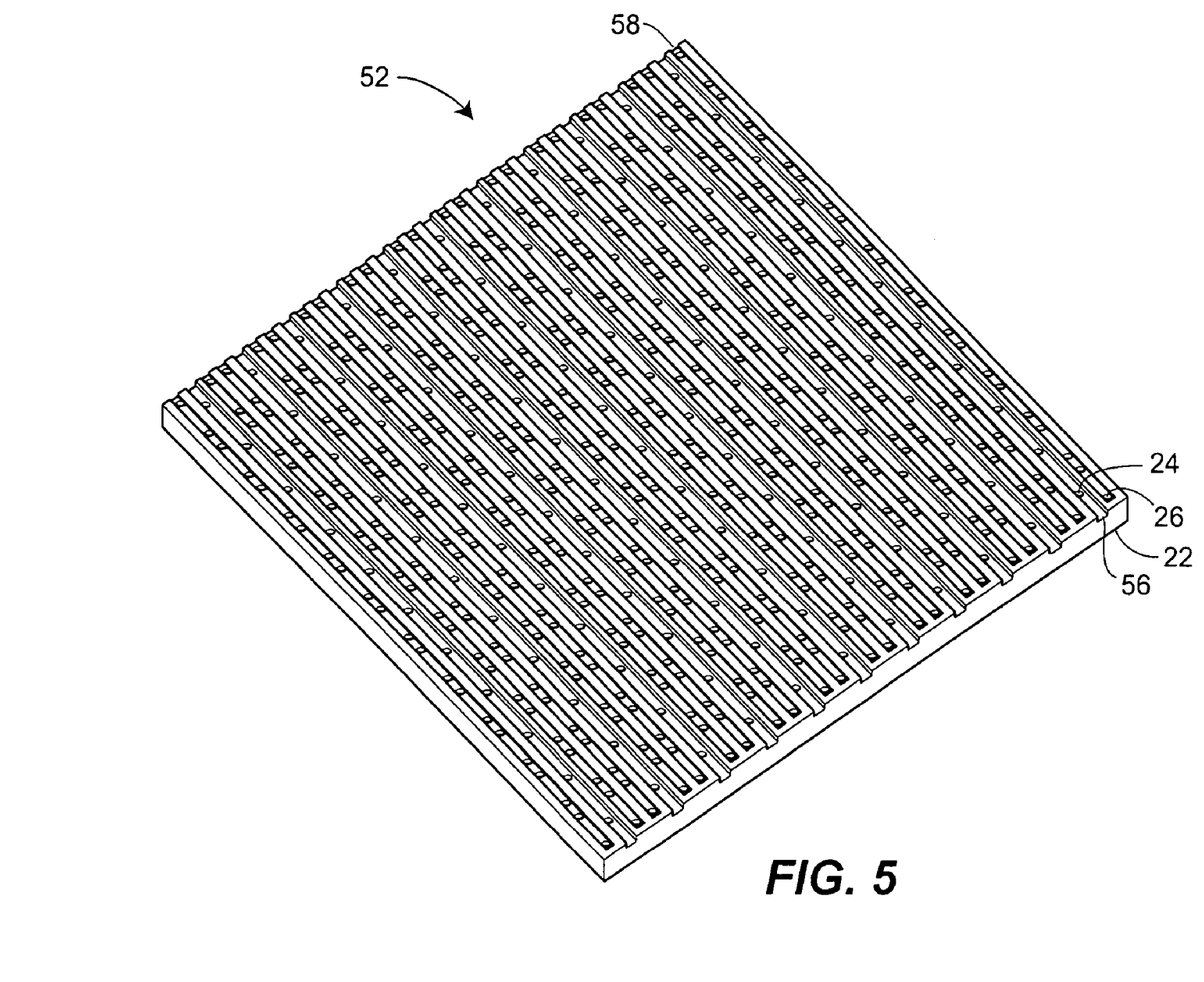
FIG. 5 is a schematic representation of an eleven-by-eleven (121 unit element) array of unit elements of FIG. 1 attached to a manifold.
Figure 6:
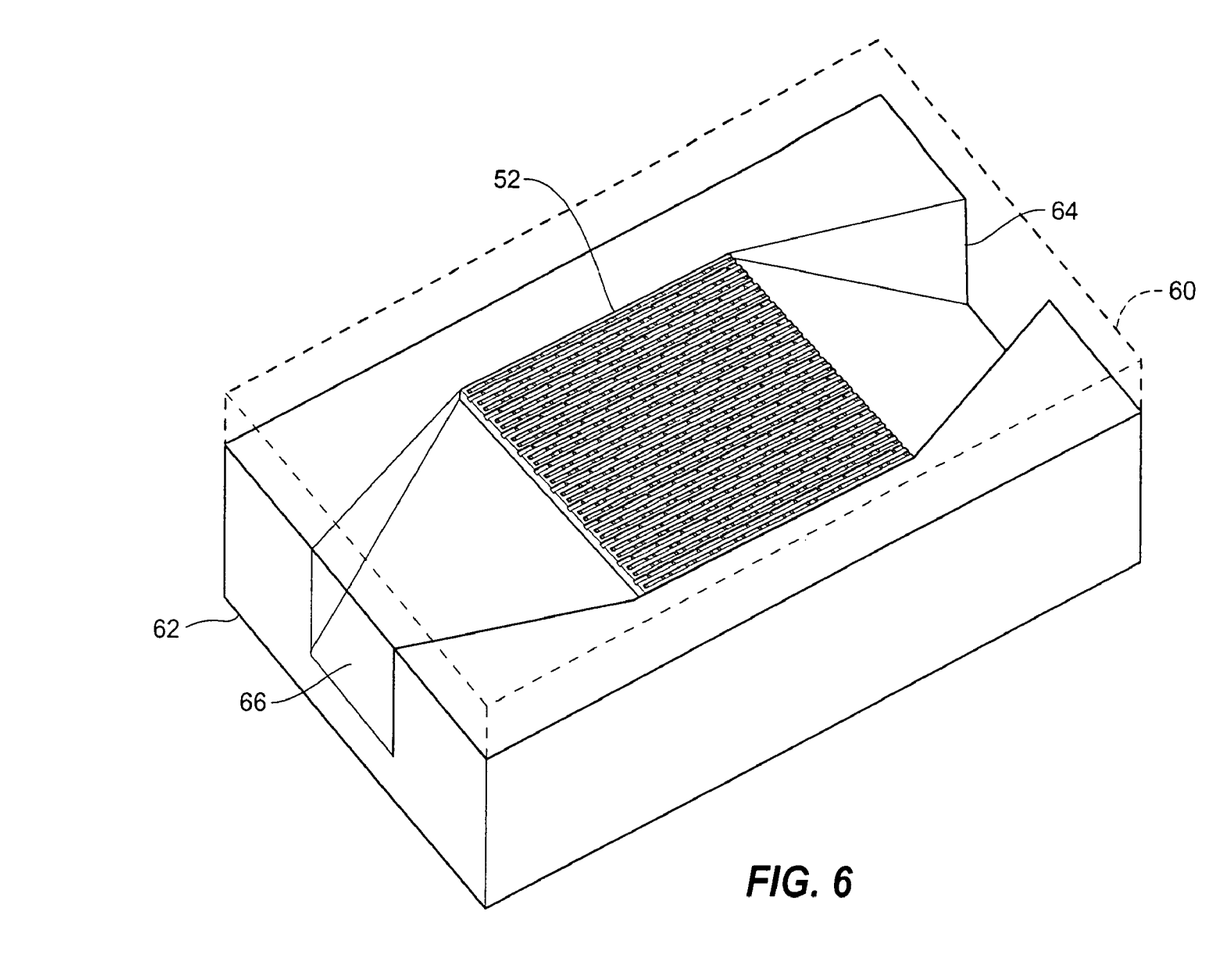
FIG. 6 is a schematic representation of a heat sink assembly using the 121 unit element array of FIG. 5.

FIG. 5 depicts an eleven-by-eleven array of unit elements 22 that together form a 121-unit heat sink assembly 52. The 121-unit heat sink assembly 52 may include manifold walls 54, shown above the unit elements 22 in FIG. 5. In a similar fashion to the manifold 42 of FIG. 4, the manifold walls 54 of FIG. 5 may define inlet openings 56, each in fluid communication with a plurality of fluid inlet tubes 24, and outlet openings 58, each of which may be in fluid communication with a plurality of fluid outlet tubes 26. As shown in FIG. 6, a cover plate 60 may be disposed over the 121-unit heat sink assembly 52 that may be in turn mounted to an electronic assembly 62 that may include a fluid inlet opening 64 and a fluid outlet opening 66.

Figure 7:
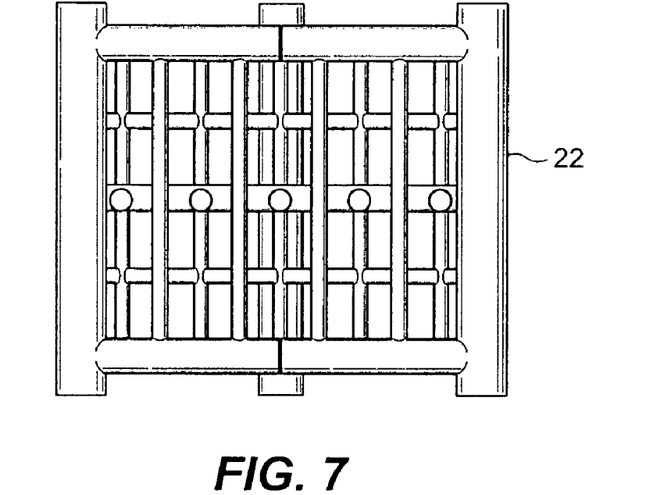
FIG. 7 is a schematic representation of a unit element showing twelve layers that may be used to form the unit element and passages therein.
Figure 8:
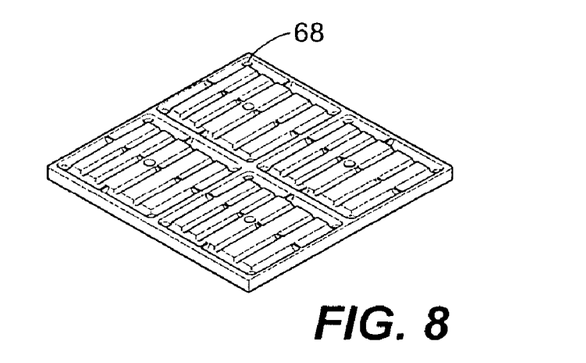
FIGS. 8-11 are schematic representations of details of pattern layers that may be used to form four unit elements.
Figure 9:
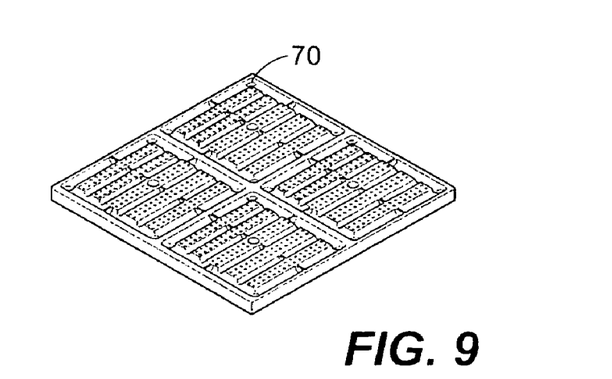
Figure 10:
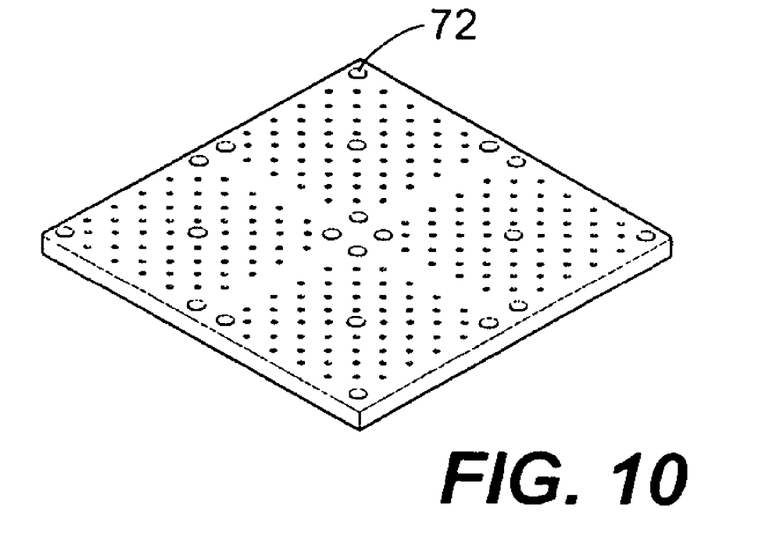
Figure 11:
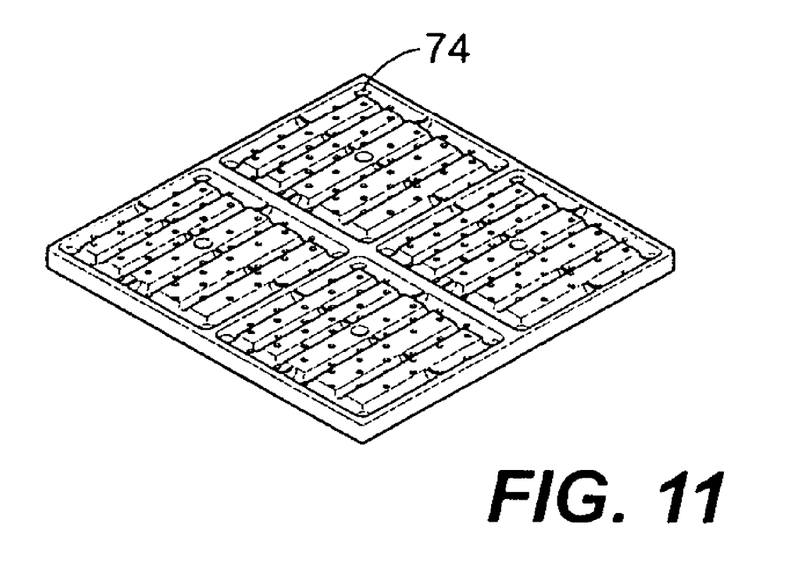

As shown in FIG. 7, each unit element 22 may be formed of a plurality of layers, such as layers 68, 70, 72, and 74, having patterns shown in FIGS. 8-11, respectively. Thus, each unit element 22 may be fabricated in layers, facilitating automated, efficient and inexpensive manufacturing techniques.

Figure 12:
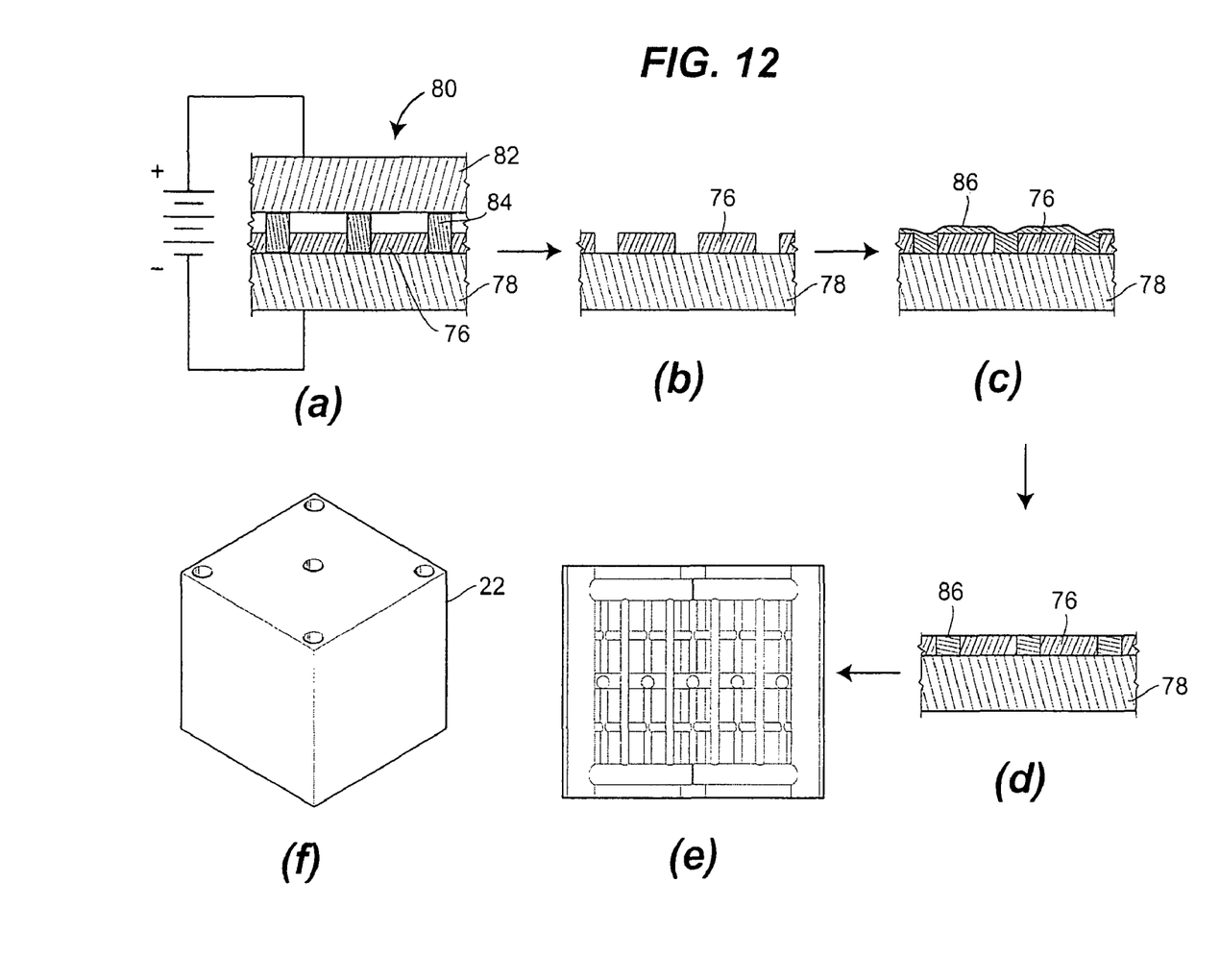
FIG. 12 schematically depicts fabrication steps that may be used to form a unit element.

FIG. 12 shows a fabrication procedure, similar to the EFAB™ technology (Cohen et al., 1999), that may be used to form the three dimensional micro-structure of each unit element 22. This method has met the challenges of making arbitrary 3-D microstructures with possible automated mass production capability.

The structure of the unit element 22 may be conceptually divided into layers that have unique patterns, such as those shown in FIG. 7. As shown in cross section at step (a) of FIG. 12, a structural material 76 is selectively deposited (e.g., by electroplating) on to a substrate 78 using a reusable mask 80 including an anode portion 82 and insulation portion 84. The reusable mask 80 may be developed and fabricated using a traditional lithographic method. Next, the reusable mask 80 is removed, leaving the structural material 76 on the substrate 78, as shown in cross section at step (b) of FIG. 12. Next, as shown in cross section at step (c) of FIG. 12, sacrificial material 86 is deposited (e.g., by electroplating) onto the structural material. Next, as shown in cross section at step (d) of FIG. 12, the surface is planarized and, as depicted in cross section at step (e) of FIG. 12, the foregoing process may be repeated to build up successive layers to form the three-dimensional microstructure of the unit element 22. Next, as depicted in a perspective view at step (f), the final unit element 22 is formed by removing the sacrificial material 86, for example, by etching or firing.

Figure 13:
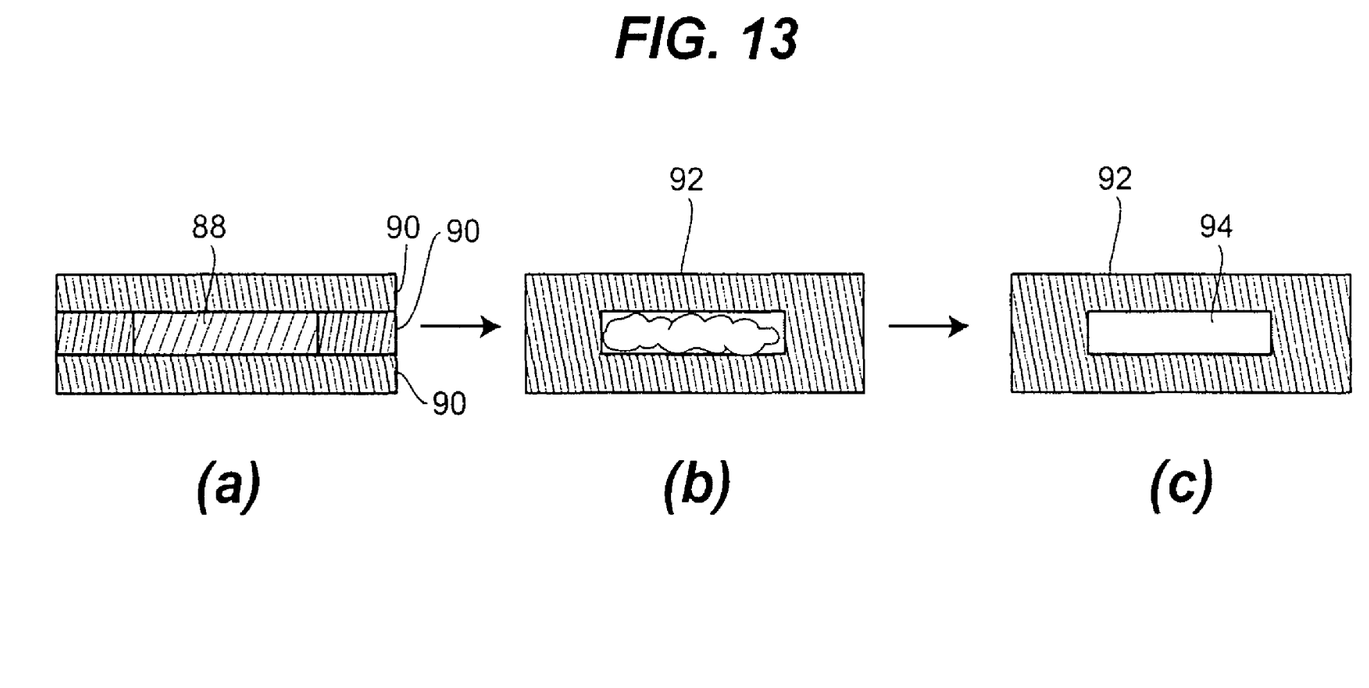
FIG. 13 schematically depicts other fabrication steps that may be used to form a unit element.

FIG. 13 depicts, in cross-sectional views, another method that may be used to form the unit elements 22. In this method, laser machined Kapton® (polyimide) inserts 88 are embedded into thick film silver layers 90. In step (a) of FIG. 13 a Kapton® D insert 88 is embedded between silver tape layers 90, after which the embedded Kapton® insert 88 may be vaporized during a firing and sintering stage, shown at step (b), producing a finished solid silver substrate 92 with an embedded channel structure 94, shown at step (c) of FIG. 13. The shape of the channel structure 94 may be controlled by the laser machining of the Kapton® to form complex microscale channel structures embedded in the solid silver substrate 94.

The established co-fired behavior of silver and low temperature co-fired ceramic (LTCC) tapes may allow heat sink structures to be embedded within LTCC substrates directly moving heat from heat source such as electronic components. This technique also has the potential to create a counter-flow fractal channel structure to make a heat exchanger. Thick film tape casting has been a technique used for fabrication of ceramic substrates for multi-layer ceramic packages. Tape casting is a process in which a slurry is created through the mixture of fine particles, a solvent, a dispersant, binders, and a plasticizer. The slurry is then cast into thin sheets with a typical thickness in the range of from about 25 to about 500 micrometers. The tape is then dried, stacked, and fired to the sintering temperature of the particles to form a solid structure. Thick film silver tape was originally developed to be co-fired with ceramic thick films in order to decrease the overall thermal resistance of the substrate, and to aid in spreading heat generated embedded electronics fed to the silver layer through thermal vias. Using the method described above in connection with FIG. 13, passages having dimensions on the order of 62 micrometers in width and 10 micrometers in height may be formed.

Fluids that may be used in connection with the unit element 22 in a heat sink include encapsulated phase change nanoparticle materials, non-encapsulated phase change nanoparticle materials, emulsion phase change nanoparticle materials, and the phase change material may include a liquid encapsulated in a polymer material.

Preliminary analysis indicates that a heat sink having a 10 by 10 array of 100 unit elements 22 has an overall thermal resistance about 0.02° C./(W/cm$^2$). Under the constraint of $T_{S,max}$=120° C., the heat sink can transfer about 4,000 W/cm$^2$ using pure water, or 6,800 W/cm$^2$ if the fluid contains 50% nano phase change ice particles. For this case, the Reynolds number based on the maximum tube diameter (=122 μm for both inlet and outlet diameters) is 1,500, which results in a pressure drop of about 250 kPa and pumping power of about 0.051 W.

Nanoscale phase change materials (NPCM) may be used as cooling fluids to reduce the maximum temperature significantly. Using encapsulated NPCM will ensure the controllability and reliability of the phase chance process unlike boiling process. Although a liquid and particle mixture (slurry) will increase the effective viscosity, it has minor effect on the total pressure drop as long as the tube diameter to particle diameter ratio maintains at a reasonably large value. This is because the slurry flow tends to create a particle-free boundary layer near the tube walls.

The range of operating conditions for the proposed heat sink is generally compatible to the available micro pump technology. For many practical electronic systems, multiple heat sinks may be used. A centralized pump/refrigerating system is easily implemented to deliver required pumping and cooling powers.

The heat sink assembly 52 may be made up of 121 unit elements 22 connected in parallel by a manifold. Each element may be a 360×360×100 µm cube on top of which is placed a 40 µm high manifold. The overall size of the heat sink assembly 52 may be about 4 mm×4 mm in length and width, and about 240 µm in height.

An example of suitable materials for constructing the unit elements 22 is nickel as the structural material and copper as the sacrificial material. These materials may be deposited and remain attached to an alumina substrate. The design may be constructed using twenty-four 10 µm thick layers, of which only five contain a unique pattern.

The heat sink assembly 52 may use liquid convection heat transfer, for example, to effectively transport heat from an area of high heat flux to a location where a large surface area pin fin heat sink, and/or a refrigeration system (not shown) that can effectively dissipate the heat into the surrounding medium. A fluid, such as water, may be pumped into the manifold using a micro pump (not shown). The fluid flows through the designed network removing heat from the heat sink assembly 52.

Utility and Applications:

The heat sink design is able to remove heat more efficiently than current methods in use. These methods include: Pin Fin Heatsinks, Microchannels, Heat Pipes, Micro Jet Impingement, and Thermoelectric cooling. The design also shows the ability to adapt to change. As microelectronics become smaller and faster, designs with even higher surface-to-volume ratios may be designed to meet the current needs of the market, for example, by using 6-level or 8-level networks of tubes.

Possible applications for the heat sink assembly 52 include, but are not limited to: Laptop Computers; Desktop Computers; Cell Phones; MEMS devices; and any other applications that require the cooling of a microdevice. As a specific example, the heat sink assembly 52 may be placed on top of a Multichip Module (MCM) or below a diode and fed by thermal vias. The 3-D design of the device also allows it to be implemented in 3-D MEMS devices. The design can also be implemented into 3-D electronic Packaging systems.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

Other aspects and features of the present invention can be obtained from a study of the drawings, the disclosure, and the appended claims.

What is claimed is:

1. A unit element for a heat sink, comprising:
a series of inlet tubes having a range of diameters, the range of diameters including a maximum inlet tube diameter and a minimum inlet tube diameter;
a series of outlet tubes having a range of diameters, the range of outlet tube diameters including a maximum outlet tube diameter and a minimum outlet tube diameter;
a plurality of flow branch points, each having an incoming flow and a plurality of outgoing flows and each formed by the intersection of two or more of the inlet or outlet tubes;
at least one inlet tube having the minimum inlet tube diameter being in flow communication with at least one outlet tube having the minimum outlet tube diameter,
wherein each of the intersections is defined by an incoming flow, a first outgoing flow perpendicular to the incoming flow, and a second outgoing flow orthogonal to the first outgoing flow.

2. The unit element for a heat sink according to claim 1, wherein the inlet tubes and the outlet tubes are constructed using a plurality of layers of material, each layer having openings adapted to define the desired geometry of each tube.

3. The unit element for a heat sink according to claim 2, wherein the layers include layers made from a structural material and a sacrificial material.

4. The unit element for a heat sink according to claim 3, wherein the sacrificial material is etched to form the opening.

5. The unit element for a heat sink according to claim 3, wherein the sacrificial material is fired to form the openings.

6. The unit element for a heat sink according to claim 3, wherein the structural material comprises silver.

7. The unit element for a heat sink according to claim 3, wherein the sacrificial material comprises copper.

8. The unit element for a heat sink according to claim 3, wherein the sacrificial material comprises a polyimide material.

9. A heat sink comprising:
a plurality of tubes in fluid communication with one another through a plurality of respective intersections, each intersection formed by an incoming tube and a plurality of outgoing tubes, each of the tubes having a radius that is essentially governed by the following relationship:

$$r_0^3 = r_1^3 + r_2^3 + r_3^3 + \ldots + r_n^3$$

where $r_0$ is the radius of the incoming tube, and $r_1, r_2, \ldots, r_n$ are the radii of the outgoing tubes,
wherein, for each of a plurality of intersections, a first outgoing tube is perpendicular to the incoming tube and a second outgoing tube is orthogonal to the first outgoing tube.

10. The heat sink according to claim 9, wherein the plurality of tubes are constructed using a plurality of layers of material, each layer having openings adapted to define the desired geometry of each tube.

11. The heat sink according the claim 10, wherein the layers include layers made from a structural material and a sacrificial material.

12. The heat sink according to claim 11, wherein the sacrificial material is etched to form the openings.

13. The heat sink according to claim 11, wherein the sacrificial material is fired to form the openings.

\* \* \* \* \*